(12) United States Patent
Lee

(10) Patent No.: US 9,215,830 B2
(45) Date of Patent: Dec. 15, 2015

(54) ELECTRONIC COMPONENT ENCLOSURE VISUAL SHIELD AND METHOD

(71) Applicant: Brocade Communications Systems, Inc., San Jose, CA (US)

(72) Inventor: Michael K. T. Lee, San Jose, CA (US)

(73) Assignee: BROCADE COMMUNICATIONS SYSTEMS, INC., San Jose, CA (US)

( * ) Notice: Subject to any disclaimer, the term of this patent is extended or adjusted under 35 U.S.C. 154(b) by 356 days.

(21) Appl. No.: 13/955,549

(22) Filed: Jul. 31, 2013

(65) Prior Publication Data

US 2014/0085818 A1 Mar. 27, 2014

Related U.S. Application Data

(60) Provisional application No. 61/704,289, filed on Sep. 21, 2012.

(51) Int. Cl.
*H05K 7/20* (2006.01)
*H05K 5/02* (2006.01)

(52) U.S. Cl.
CPC .......... *H05K 7/20145* (2013.01); *H05K 5/0213* (2013.01); *Y10T 29/49002* (2015.01)

(58) Field of Classification Search
None
See application file for complete search history.

(56) References Cited

U.S. PATENT DOCUMENTS

| | | | | |
|---|---|---|---|---|
| 5,372,543 A | * | 12/1994 | Steele | F24F 13/08 174/16.1 |
| 5,697,840 A | * | 12/1997 | Bainbridge | H05K 7/20172 361/645 |
| 5,698,818 A | * | 12/1997 | Brench | H05K 9/0041 174/383 |
| 5,969,942 A | * | 10/1999 | Heckner | H05K 7/207 165/121 |
| 7,151,666 B2 | * | 12/2006 | Song | H05K 7/1487 312/223.2 |
| 7,173,822 B2 | * | 2/2007 | Liang | H05K 9/0041 361/690 |
| 7,390,976 B2 | | 6/2008 | Liang et al. | |
| 2003/0156385 A1 | * | 8/2003 | Askeland | G06F 1/182 361/679.51 |
| 2005/0105268 A1 | * | 5/2005 | Chen | H05K 7/1487 361/692 |
| 2007/0201181 A1 | * | 8/2007 | Dubrule | H05K 5/0213 361/297 |
| 2009/0116187 A1 | * | 5/2009 | Yi | H05K 7/20145 361/692 |

OTHER PUBLICATIONS

Lee, "FIPS Level-2-Compliant Hardware Without Using Opacity Shield," U.S. Appl. No. 61/704,289, filed Sep. 21, 2012.
"Brocade ICX 6430 and 6450 Switches," Data Sheet, 2013, 12 pages, Brocade Communications Systems, Inc.
"Brocade ICX 6610 Switch," Data Sheet, 2013, 12 pages, Brocade Communications Systems, Inc.
Evans et al., "Security Requirements for Cryptographic Modules," Federal Information Processing Standards Publication, FIPS PUB 140-2, May 25, 2001, 69 pages, National Institute of Standards and Technology.
"HP Networking Switches," FIPS 140-2 Non-Proprietary Security Policy Level 2 Validation, Version 1.02, Apr. 2013, 40 pages, Hewlett-Packard Company.

* cited by examiner

*Primary Examiner* — Gregory Thompson
(74) *Attorney, Agent, or Firm* — Innovation Counsel LLP; Serge J. Hodgson

(57) ABSTRACT

An electronic device includes one or more electronic components and an electronic enclosure enclosing the electronic components. The electronic enclosure includes venting holes and flaps blocking visibility of the electronic components through the venting holes and from outside the electronic device. In addition, air readily flows through the venting holes providing adequate cooling of the electronic device.

14 Claims, 8 Drawing Sheets

ELECTRONIC COMPONENT ENCLOSURE VISUAL SHIELD AND METHOD

RELATED APPLICATIONS

This application claims the benefit of U.S. Provisional Application No. 61/704,289 filed on Sep. 21, 2012, entitled "FIPS Level-2-compliant hardware without using opacity shield" of Michael Lee, which is incorporated herein by reference in its entirety.

BACKGROUND

1. Field

The present application relates to the field of electronics, and more particularly, to structures for visually shielding and cooling electronic components and related methods.

2. Description of the Related Art

An electronic device typically includes a plurality of electronic components contained within an electronic enclosure. During use, these electronic components generate heat, which must be removed from the electronic enclosure.

In one example, the electronic enclosure is formed with a plurality of openings to allow airflow through the electronic enclosure. By ensuring adequate airflow, removal of the heat generated by the electronic components is achieved.

In one example, the electronic device, e.g., a switch, processes critical information. Federal Information Processing Standards (FIPS) specify requirements for the design of the electronic device to prevent unauthorized access to the critical information being processed by the electronic device. One of these requirements, sometimes called an opacity requirement, is that critical electronic components of the electronic device are not visible from outside the electronic enclosure.

To block visibility of the critical electronic components, the critical electronic components are covered by an opaque shield. Unfortunately, the opaque shield is relatively expensive thus adding to the overall manufacturing costs of the electronic device.

Further, the opaque shield restricts airflow around the electronic components thus reducing heat removal therefrom. To provide adequate airflow and cooling, additional and/or larger fans are sometimes needed. Unfortunately, these additional and/or larger fans add to both the manufacturing and operating costs of the electronic device.

SUMMARY

In accordance with one embodiment, an electronic device includes one or more electronic components and an electronic enclosure enclosing the electronic components. The electronic enclosure includes venting holes and flaps blocking visibility of the electronic components through the venting holes and from outside the electronic device.

By blocking visibility of the electronic components from outside of the electronic device, the electronic device complies with the opacity requirement of the Federal Information Processing Standards (FIPS) e.g., FIPS level 2. Further, visibility of the electronic components is blocked without use of an opaque shield thus minimizing manufacturing cost of the electronic device.

In addition, air readily flows through the venting holes providing adequate cooling of the electronic device. Accordingly, use of additional and/or larger fans to cool the electronic device is avoided thus further minimizing manufacturing and operating costs of the electronic device. Further, by avoiding use of additional and/or larger fans to cool the electronic device, acoustical noise is minimized.

These and other features in accordance with various embodiments will be more readily apparent from the detailed description set forth below taken in conjunction with the accompanying drawings.

BRIEF DESCRIPTION OF THE DRAWINGS

In the following description, the same or similar elements are labeled with the same or similar reference numbers.

DETAILED DESCRIPTION

Figure 1:
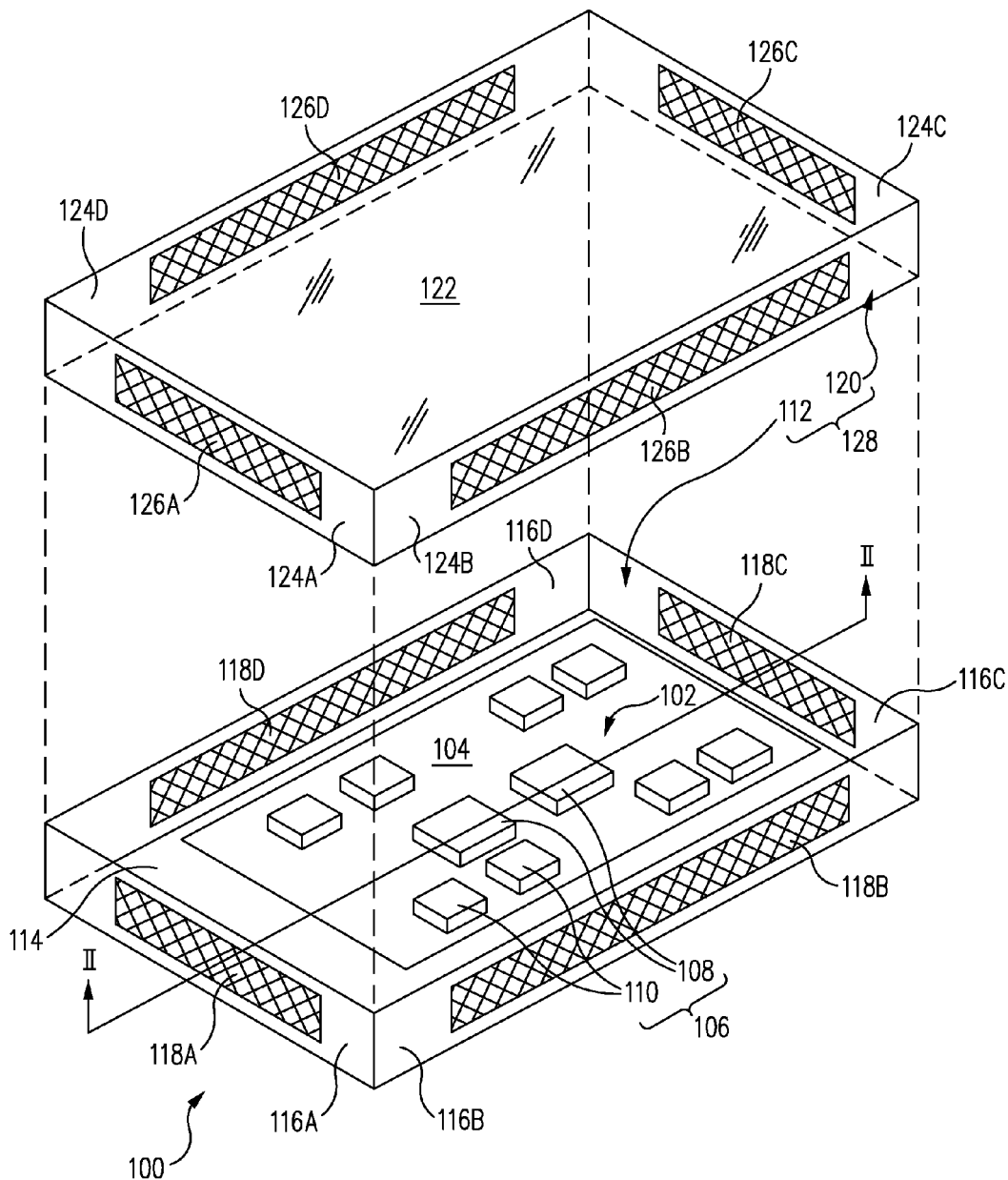
FIG. 1 is an exploded perspective view of an electronic device in accordance with one embodiment.

As an overview and in accordance with one embodiment, referring to FIGS. 1, 2, 3, and 4 together, an electronic device 100 includes one or more critical electronic components 108 and an electronic enclosure 128 enclosing critical electronic components 108. Electronic enclosure 128 includes venting holes 202 and flaps 206 blocking visibility of critical electronic components 108 through venting holes 202 and from outside electronic device 100.

By blocking visibility of critical electronic components 108 from outside of electronic device 100, electronic device 100 complies with the opacity requirement of the Federal Information Processing Standards (FIPS) e.g., FIPS level 2. Further, visibility of critical electronic components 108 is blocked without use of an opaque shield thus minimizing manufacturing cost of electronic device 100.

In addition, air readily flows through venting holes 202 providing adequate cooling of electronic device 100. Accordingly, use of additional and/or larger fans to cool electronic device 100 is avoided thus further minimizing manufacturing and operating costs of electronic device 100. Further, by avoiding use of additional and/or larger fans to cool electronic device 100, acoustical noise is minimized.

Now in more detail, FIG. 1 is an exploded perspective view of an electronic device 100 in accordance with one embodiment. Electronic device 100, e.g., a cryptographic module such as a switch, includes a printed circuit board assembly (PCBA) 102. Printed circuit board assembly 102 includes a printed circuit board 104, sometimes called a larger substrate, and one or more electronic components 106 mounted to printed circuit board 104.

In accordance with this embodiment, electronic components 106 include one or more critical electronic components 108 and one or more noncritical electronic components 110. Critical electronic components 108 are generally electronic components that actively process signals and information passing through electronic device 100. Examples of critical electronic components 108 include electronic components containing integrated circuits, application-specific integrated circuits, and/or other components containing active circuitry.

In one embodiment, critical electronic components 108 are electronic components about which knowledge thereof is useful in compromising the security of electronic device 100. For example, critical electronic components 108 have markings and/or part numbers thereon which provide identifying information about critical electronic components 108. An unauthorized person attempting to compromise the security of electronic device 100 would be aided by viewing critical electronic components 108.

In contrast, noncritical electronic components 110 are generally electronic components that passively process signals and information passing through electronic device 100. Examples of noncritical electronic components 110 include capacitors, resistors, inductors and/or other passive components.

In one embodiment, noncritical electronic components 110 are electronic components about which knowledge thereof is not particularly useful in compromising the security of electronic device 100. For example, noncritical electronic components 110 have markings thereon which provide identifying information about noncritical electronic components 110. However, an unauthorized person attempting to compromise the security of electronic device 100 would not be assisted by viewing noncritical electronic components 110.

In one embodiment, whether an electronic component 106 is a critical electronic component 108 or a noncritical electronic component 110 is defined by the security requirements for cryptographic modules as set forth in the Federal Information Processing Standards (FIPS) or is otherwise definable as those of skill in the art will understand in light of this disclosure.

In one embodiment, all of electronic components 106 are critical electronic components 108.

Printed circuit board assembly 102 including electronic components 106 are mounted to a chassis base 112, sometimes called a chassis bottom.

In accordance with this embodiment, chassis base 112 includes a chassis base plate 114 and chassis sidewalls 116A, 116B, 116C, 116D. Chassis base plate 114 is a rectangular plate generally parallel to printed circuit board assembly 102. Although various features may be described as being parallel, perpendicular, or having other relations, in light of this disclosure, those of skill in the art will understand that the various features may not be exactly parallel, perpendicular, but only substantially parallel and perpendicular. Further, the features may not be exactly planar, for example, may include indentations or protrusions.

Chassis sidewalls 116A, 116B, 116C, 116D, collectively chassis sidewalls 116, extend perpendicularly upward, e.g., in a first direction, from chassis base plate 114. In accordance with this embodiment, chassis sidewalls 116A, 116B, 116C, 116D include chassis base venting patterns 118A, 118B, 118C, 118D, respectively. Chassis base venting patterns 118A, 118B, 118C, 118D, collectively chassis base venting patterns 118, include a pattern of venting apertures, e.g., one or more venting apertures, as described in further detail below.

Electronic device 100 further includes a cover 120, sometimes called a top cover. Cover 120 includes a cover plate 122 and cover sidewalls 124A, 124B, 124C, 124D, collectively cover sidewalls 124.

Cover plate 122 is a rectangular plate generally parallel to chassis base plate 114 when cover 120 is mounted to chassis base 112. Cover sidewalls 124 extend perpendicularly downward, e.g., in a second direction opposite the first direction, from cover plate 122.

In accordance with this embodiment, cover sidewalls 124A, 124B, 124C, 124D include cover venting patterns 126A, 126B, 126C, 126D, respectively. Cover venting patterns 126A, 126B, 126C, 126D, collectively cover venting patterns 126, include a pattern of venting apertures, e.g., one or more venting apertures, as described in further detail below.

Cover 120 is mounted to chassis base 112, e.g., using screws or other fasteners, to form an electronic enclosure 128 around printed circuit board assembly 102. Stated another way, cover 120 and chassis base 112 collectively form electronic enclosure 128. Electronic enclosure 128 encloses printed circuit board assembly 102, blocks visibility to critical electronic components 108, while allows adequate airflow sufficient to cool electronic device 100.

More particularly, cover 120 is configured to fit around the outside or inside of chassis base 112 and to be secured thereto. Once secured, cover sidewalls 124A, 124B, 124C, 124D are adjacent to chassis sidewalls 116A, 116B, 116C, 116D, respectively. Further, cover venting patterns 126A, 126B, 126C, 126D are adjacent to and aligned with chassis base venting patterns 118A, 118B, 118C, 118D, respectively. Cover venting patterns 126 cooperate with chassis base venting patterns 118 to form electronic enclosure openings through which air can flow yet which blocks line of sight access, sometimes called eye sight, to critical electronic components 108 as discussed below.

Although all four chassis sidewalls 116 are illustrated as each including a chassis base venting pattern 118, in another embodiment, only one, two, or three of chassis sidewalls 116 includes a chassis base venting pattern 118. For example, only chassis sidewalls 116A, 116B, 116C include chassis base venting patterns 118A, 118B, 118C, respectively. Chassis sidewall 116D is formed with an absence of a venting pattern, e.g., includes data input/output ports or other structures.

Similarly, although all four cover sidewalls 124 are illustrated as each including a cover venting pattern 126, in another embodiment, only one, two, or three of cover sidewalls 124 includes a cover venting pattern 126. For example, only cover sidewalls 124A, 124B, 124C include cover venting patterns 126A, 126B, 126C, respectively. Cover sidewall 124D is formed with an absence of a venting pattern, e.g., includes a cut out around data input/output ports or other structures of chassis base 112.

Figure 2:
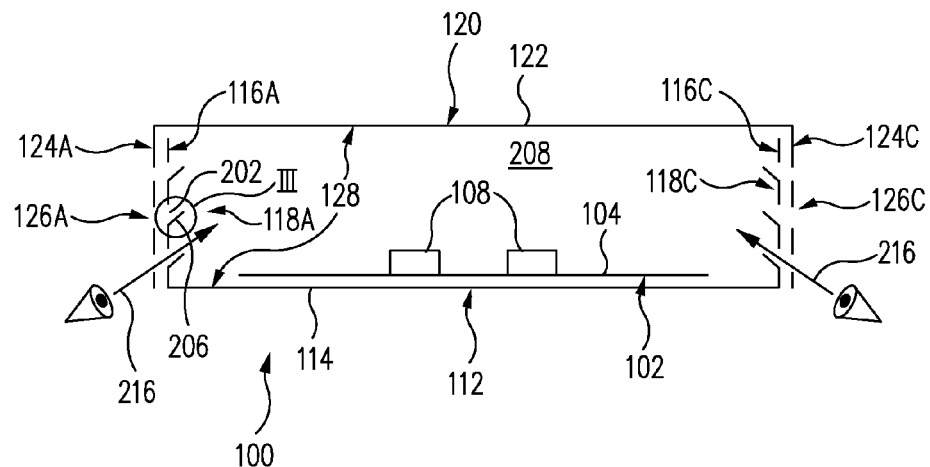
FIG. 2 is a cross-sectional view of the electronic device along the line II-II of FIG. 1 in accordance with one embodiment.
Figure 3:
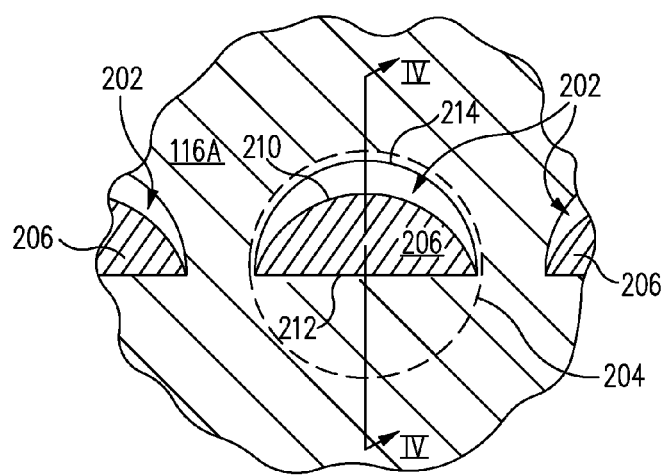
FIG. 3 is a side plan view of a region III of a chassis sidewall of a chassis base of FIG. 2 illustrating venting holes in accordance with one embodiment.
Figure 4:
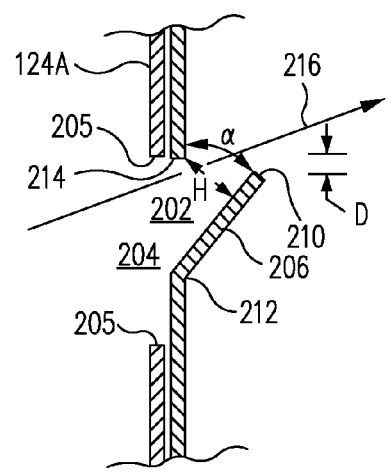
FIG. 4 is a cross-sectional view along the line IV-IV of a venting hole of FIG. 3 and a respective cover venting hole of a cover in accordance with one embodiment.

FIG. 2 is a cross-sectional view of electronic device 100 along the line II-II of FIG. 1 in accordance with one embodiment. FIG. 3 is a side plan view of a region III of chassis sidewall 116A of chassis base 112 of FIG. 2 illustrating venting holes 202 in accordance with one embodiment. FIG. 4 is a cross-sectional view along the line IV-IV of a venting hole 202 of FIG. 3 and a respective cover venting hole 204 of cover 120 in accordance with one embodiment.

Referring now to FIGS. 1, 2, 3, and 4 together, chassis base venting patterns 118 include a plurality of venting holes 202, sometimes called angled venting holes or visually obstructed venting holes. Venting holes 202 can be arranged in any of one of a number of configurations to form a chassis base venting pattern 118. For example, venting holes 202 are arranged in rows, columns, arrays, or other arrangements.

Paying particular attention to a first venting hole 202 of the plurality of venting holes 202, chassis sidewall 116A is cut to form venting hole 202. In accordance with one embodiment, chassis sidewall 116A is cut, e.g., punched, to form a flap 206 protruding inwards from chassis sidewall 116A. As used herein, inwards or inner is a direction from electronic enclosure 128 towards a volume 208 defined within electronic enclosure 128. Conversely, outwards or outer is a direction from electronic enclosure 128 away from volume 208.

Flap 206 is defined by an inner flap edge 210 and a fold 212. Flap edge 210 extends inward from a plane defined by chassis sidewall 116A and extends from fold 212. Flap edge 210 is shaped as a smooth curve in this embodiment, e.g., is semispherical. However, in other embodiments, flap edge 210 has other shapes including abrupt edges.

Flap 206 is attached to chassis sidewall 116A at fold 212. Flap 206 extends inwards from fold 212 to flap edge 210. Fold 212 is a bend between chassis sidewall 116A and flap 206.

In accordance with this embodiment, fold 212 is a line that lies in a plane parallel to chassis base plate 114. Flap 206 extends upwards from fold 212 and in a direction away from chassis base plate 114. In one embodiment, the angle α between chassis sidewall 116A and flap 206 is less than or equal to 90 degrees, e.g., is 30, 45 or 60 degrees.

Venting hole 202 corresponds in shape to flap 206. Venting hole 202 is defined by a flap cutout edge 214 and fold 212. Flap cutout edge 214 corresponds to flap edge 210 of flap 206. More particularly, chassis sidewall 116A is cut at flap cutout edge 214 to form flap 206, which is then bent at fold 212 from chassis sidewall 116A. Accordingly, venting hole 202 is the same shape as flap 206.

Flap 206 defines the line of sight 216 through venting hole 202. More particularly, flap 206 partially obstructs the view through venting hole 202 such that critical electronic components 108 are not visible through venting hole 202. Generally, the angle α is set to be as great as possible to allow maximum airflow through venting hole 202 while at the same time blocking line of sight access to critical electronic components 108. The angle α depends upon the relative position between printed circuit board assembly 102 and the position of venting hole 202.

In one embodiment, the angle α is set to maximize the H/D ratio while blocking visibility of critical electronic component 108. The H/D ratio is the ratio of flap height H to flap depth D. Flap height H is defined as the maximum distance between flap 206 and flap cutout edge 214 along a line perpendicular to flap 206. Flap depth D is the maximum distance between inner flap edge 210 and flap cutout edge 214 along a line parallel to chassis sidewall 116A, e.g., downward in the view of FIG. 4. In various examples, the H/D ratio is approximately 2, 1.414, or 1.732 when angle α is 30, 45, or 60 degrees, respectively.

More particularly, line of sight 216 is defined by a line between flap cutout edge 214 and flap edge 210. Beyond line of sight 216, e.g., downward towards critical electronic components 108, flap 206 blocks the view through venting hole 202. Line of sight 216 is offset from critical electronic components 108 such that critical electronic components 108 cannot be seen through venting hole 202.

By blocking visibility of critical electronic components 108 from outside of electronic device 100, electronic device 100 complies with the opacity requirement of the Federal Information Processing Standards (FIPS), e.g., FIPS level 2. Further, visibility of critical electronic components 108 is blocked without use of an opaque shield thus minimizing manufacturing cost of electronic device 100.

In addition, air readily flows through venting holes 202 providing adequate cooling of electronic device 100. Accordingly, use of additional and/or larger fans to cool electronic device 100 is avoided thus further minimizing manufacturing and operating costs of electronic device 100. Further, by avoiding use of additional and/or larger fans to cool electronic device 100, acoustical noise is minimized.

Cover venting patterns 126 also include a plurality of cover venting holes 204, e.g., defined by venting hole edges 205. Cover venting holes 204 can be arranged in any of one of a number of configurations corresponding to venting holes 202. For example, cover venting holes 204 are arranged in rows, columns, arrays, or other arrangements. More particularly, cover venting holes 204 of cover venting patterns 126 are aligned with and expose venting holes 202 to the ambient environment. The ambient environment is the environment outside of electronic enclosure 128.

In one embodiment, paying particular attention to FIG. 3, cover venting holes 204 of cover 120 as indicated by the dashed circle are larger than venting holes 202 of chassis base 112. Accordingly, venting holes 202 are completely exposed to the ambient environment thus assuring unrestricted airflow through venting holes 202.

In one embodiment, cover venting holes 204 of cover 120 are circular openings. In another embodiment, cover venting holes 204 are the same shape and size as venting holes 202. In yet other embodiments, a plurality of venting holes 202 are exposed through a single cover venting hole 204. In yet other embodiments, cover 120 is formed with an absence of cover sidewalls 124 and thus chassis sidewalls 116 including venting holes 202 are directly exposed to the ambient environment. In another embodiment, cover sidewalls 124 do not extend over venting holes 202 thus leaving venting holes 202 exposed.

As illustrated in FIGS. 2 and 4, cover sidewalls 124 are directly adjacent to, e.g., in direct contact with, chassis sidewalls 116. More particularly, a space between cover sidewalls 124 and chassis sidewalls 116 is not necessary or provided. By having cover sidewalls 124 be directly adjacent to chassis sidewalls 116, the overall size of electronic device 100 is minimized. However, in another embodiment, a space is provided between cover sidewalls 124 and chassis sidewalls 116.

Figure 5:
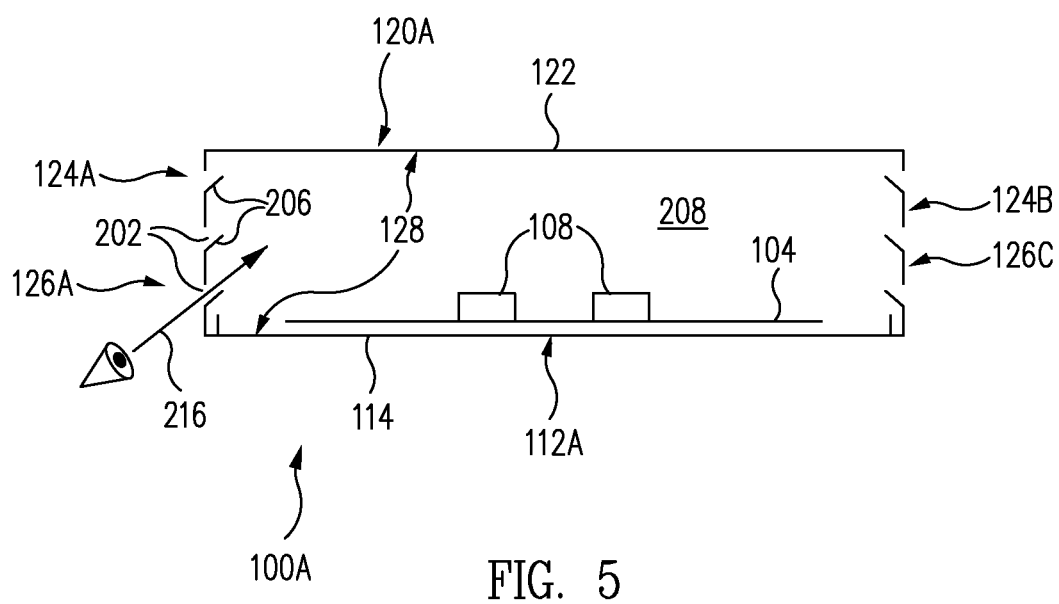
FIG. 5 is a cross-sectional view of an electronic device in accordance with another embodiment.

FIG. 5 is a cross-sectional view of an electronic device 100A in accordance with another embodiment. Electronic device 100A of FIG. 5 is similar to electronic device 100 of FIGS. 1-4 and only the significant differences are discussed below.

Referring now to FIG. 5, in accordance with this embodiment, venting holes 202 and flaps 206 are formed in cover sidewalls 124 of a cover 120A. Further, a chassis base 112A is formed with an absence of chassis sidewalls such as chassis sidewalls 116 of electronic device 100 of FIGS. 1-4. By use of venting holes 202 and flaps 206 in cover sidewalls 124, adequate airflow is provided while at the same time visibility of critical electronic components 108 is blocked in an arrangement where an overlap of cover sidewalls 124 and chassis sidewalls is avoided.

Figure 6:
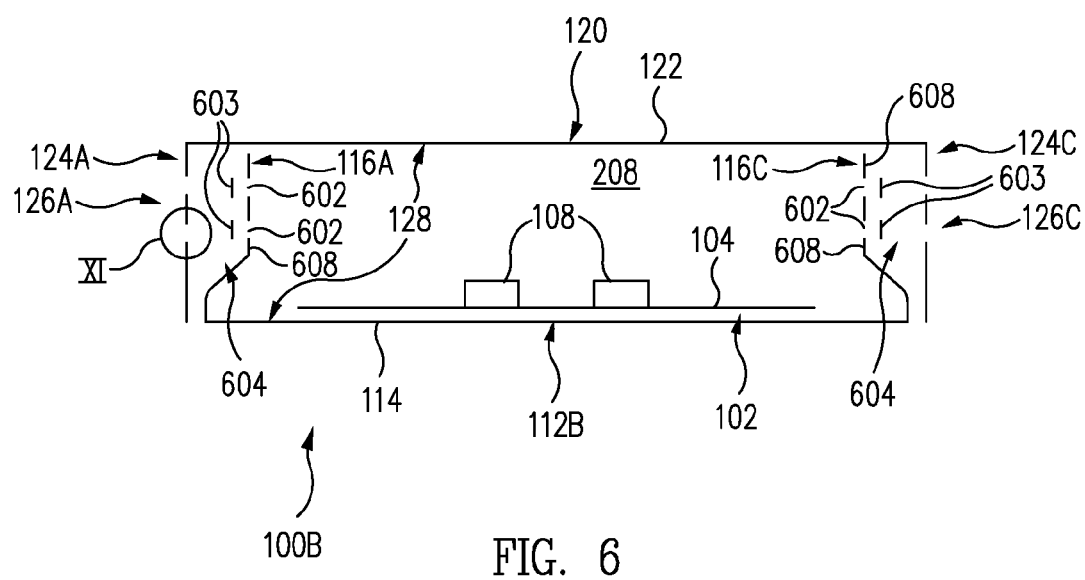
FIG. 6 is a cross-sectional view of an electronic device in accordance with another embodiment.
Figure 7:
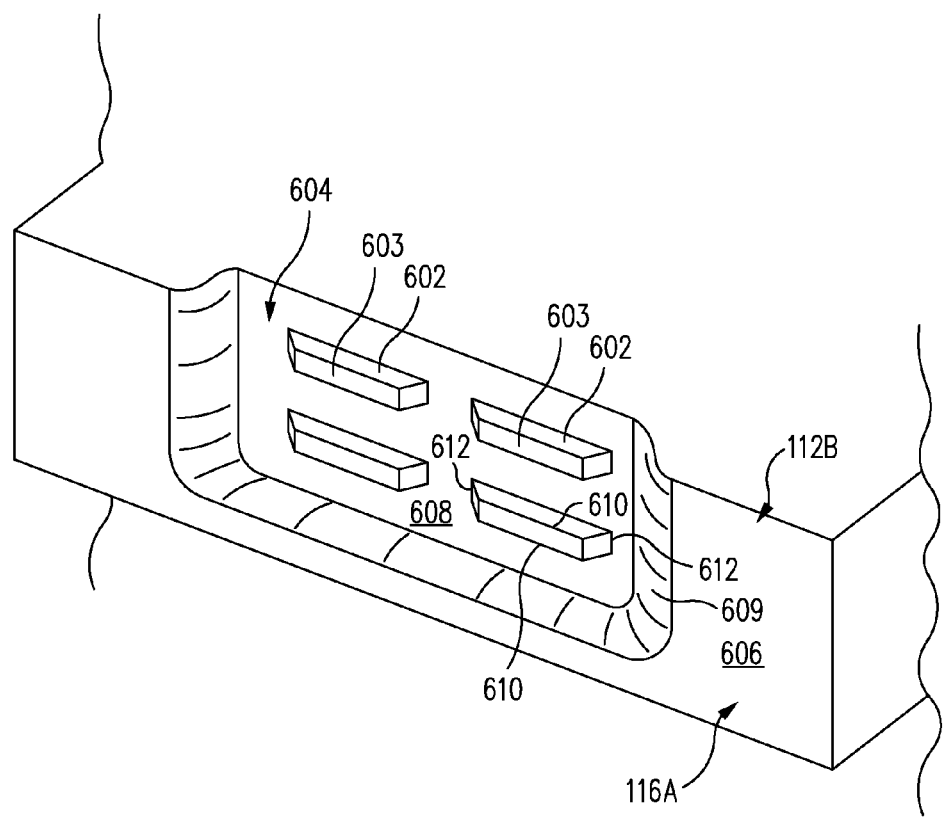
FIG. 7 is a perspective view of a chassis sidewall of a chassis base of the electronic device of FIG. 6 having venting holes and louvers formed therein in accordance with one embodiment.
Figure 8:
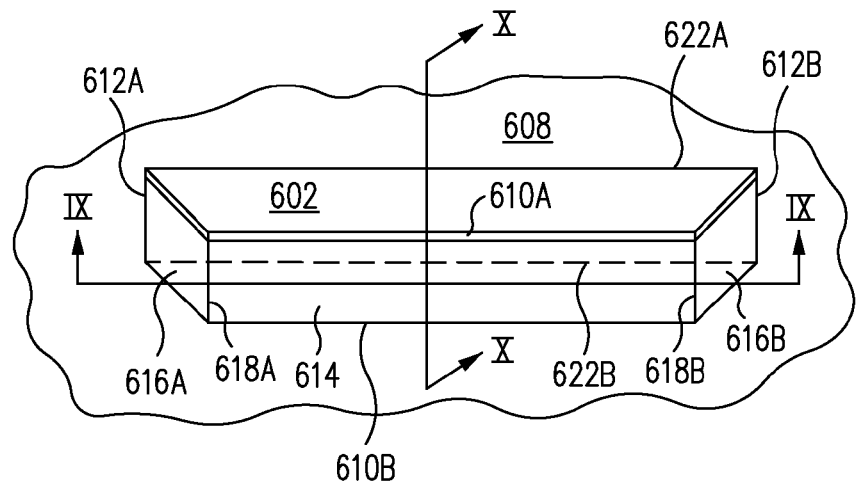
FIG. 8 is an enlarged perspective view of a louver of FIG. 7 in accordance with one embodiment.
Figure 9:
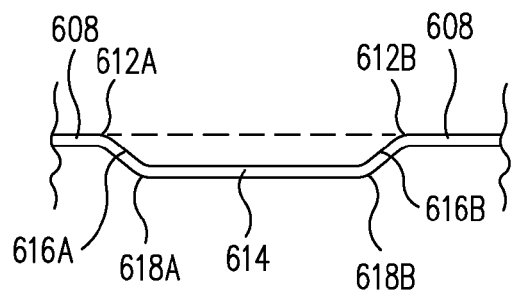
FIG. 9 is a cross-sectional view of the louver along the line IX-IX of FIG. 8.
Figure 10:
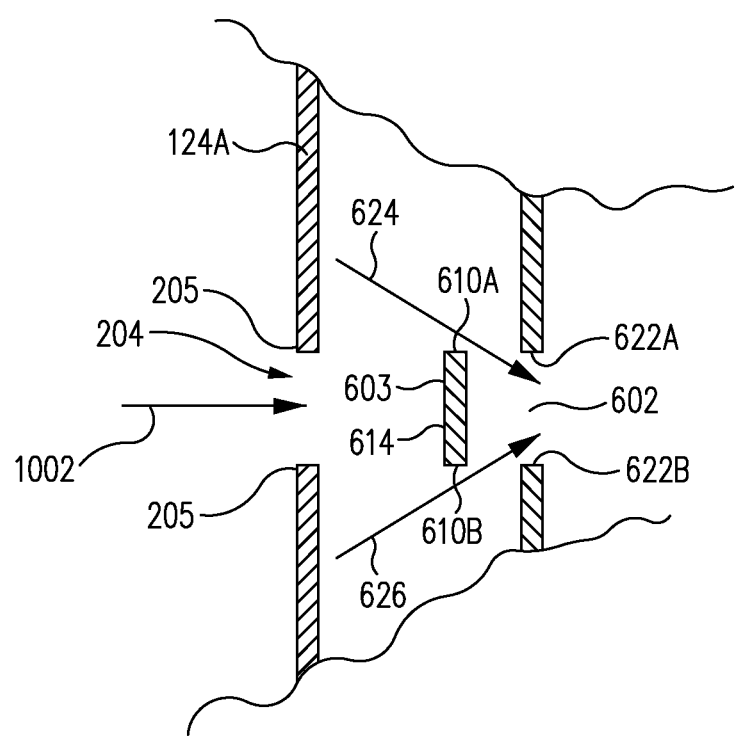
FIG. 10 is a cross-sectional view of the louver along the line X-X of FIG. 8.

FIG. 6 is a cross-sectional view of an electronic device 100B in accordance with another embodiment. FIG. 7 is a perspective view of a chassis sidewall 116A of a chassis base 112B of electronic device 100B of FIG. 6 having venting holes 602 and louvers 603 formed therein in accordance with one embodiment. FIG. 8 is an enlarged perspective view of a louver 603 of FIG. 7 in accordance with one embodiment. FIG. 9 is a cross-sectional view of louver 603 along the line IX-IX of FIG. 8. FIG. 10 is a cross-sectional view of louver 603 along the line X-X of FIG. 8. Electronic device 100B of FIG. 6-10 is similar to electronic device 100 of FIGS. 1-4 and only the significant differences are discussed below.

Referring now to FIGS. 6-10 together, in accordance with this embodiment, chassis base venting patterns 118 of chassis base 112B include venting holes 602, e.g., slot like openings, formed in chassis sidewalls 116 and covered by louvers 603. Venting holes 602 can be arranged in any of one of a number of configurations to form a chassis base venting pattern 118. For example, venting holes 602 are arranged in rows, columns, arrays, or other arrangements.

Further, chassis sidewalls 116 are formed with recesses 604 in which louver 603 are located. Recesses 604 are indentations, sometimes called hollows or pockets.

Chassis sidewalls 116 include main sidewalls 606 and recess sidewalls 608. Recess sidewalls 608 are parallel to main sidewalls 606 but located inward therefrom. Recess sidewalls 608 are connected to main sidewalls 606 by a recess transition surface 609, e.g., a curved surface, of chassis sidewall 116. Recesses 604 are defined by recess sidewalls 608.

Louvers 603 extend outward from recess sidewalls 608 into recesses 604. Louvers 603 are defined by louver edges 610 and folds 612.

Paying particular attention to a first louver 603 of the plurality of louvers 603 as illustrated in FIGS. 8-10, recess sidewall 608 of chassis sidewall 116A is cut to form louver 603. In accordance with one embodiment, recess sidewall 608 is cut, e.g., punched, to form louver 603 protruding outward from recess sidewall 608 into recess 604 while at the same time forming venting hole 602 in recess sidewall 608.

Louver 603 is defined by first and second louver edges 610A, 610B, and folds 612A, 612B. Louver edges 610A, 610B extend outwards from a plane defined by recess sidewall 608 and extend between folds 612A, 612B.

In accordance with this embodiment, louver 603 includes a strip portion 614 and connecting portions 616A, 616B. Strip portion 614 is parallel to but spaced outwards from recess sidewall 608. Strip portion 614 is a rectangular strip in accordance with this embodiment.

Connecting portions 616A, 616B extend at an angle from recess sidewall 608 at folds 612A, 612B to louver folds 618A, 618B at strip portion 614.

Connecting portions 616A, 616B and thus louver 603 is attached to recess sidewall 608 at folds 612A, 612B. Folds 612A, 612B are bends between recess sidewall 608 and connecting portions 616A, 616B. Louver folds 618A, 618B are bends between connecting portions 616A, 616B and strip portion 614.

Venting hole 602 corresponds in shape to louver 603. Venting hole 602 is defined by louver cutout edges 622A, 622B and folds 612A, 612B, e.g., is a rectangular opening. Louver cutout edges 622A, 622B correspond to louver edges 610A, 610B of louver 603. More particularly, recess sidewall 608 is cut at louver cutout edges 622A, 622B to form louver 603.

Louver 603 defines first and second lines of sight 624, 626 through venting hole 602. First and second lines of sight 624, 626 are sometimes called venting hole lines of sight. More particularly, louver 603 partially obstructs the view through venting hole 602 such that critical electronic components 108 can only be viewed at a non-perpendicular angle relative to recess sidewall 608 through venting hole 602, if at all.

More particularly, lines of sight 624, 626, sometime called upper and lower lines of sight, are defined by lines between louver cutout edges 622A, 622B and louver edges 610A, 610B, respectively. Beyond lines of sight 624, 626, i.e., at angles more perpendicular to recess sidewall 608 than lines of sight 624, 626, louver 603 blocks the view through venting hole 602.

Figure 11:
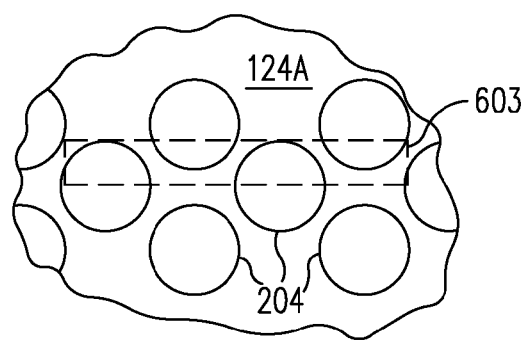
FIG. 11 is a side plan view of the region XI of a cover sidewall of the electronic device of FIG. 6 in accordance with one embodiment.

FIG. 11 is a side plan view of the region XI of cover sidewall 124A of electronic device 100B of FIG. 6 in accordance with one embodiment. Louver 603 is indicated as a dashed rectangle in the view of FIG. 11 although it is to be understood that all of louver 603 may not be visible in the view of FIG. 11, or that louver 603 may not be visible at all.

Referring now to FIGS. 6, 10, and 11 together, cover venting pattern 126A includes a plurality of cover venting holes 204 in accordance with this embodiment. The line of sight 1002, sometimes called cover venting hole line of sight 1002, through cover venting holes 204 does not align, e.g., are unaligned, with lines of sight 624, 626 through venting holes 602. Accordingly, critical electronic components 108 cannot be seen through cover venting holes 204 or generally outside of electronic enclosure 128. However, air readily flows through cover venting holes 204 and venting holes 602 providing adequate cooling of electronic device 100B.

Figure 12:
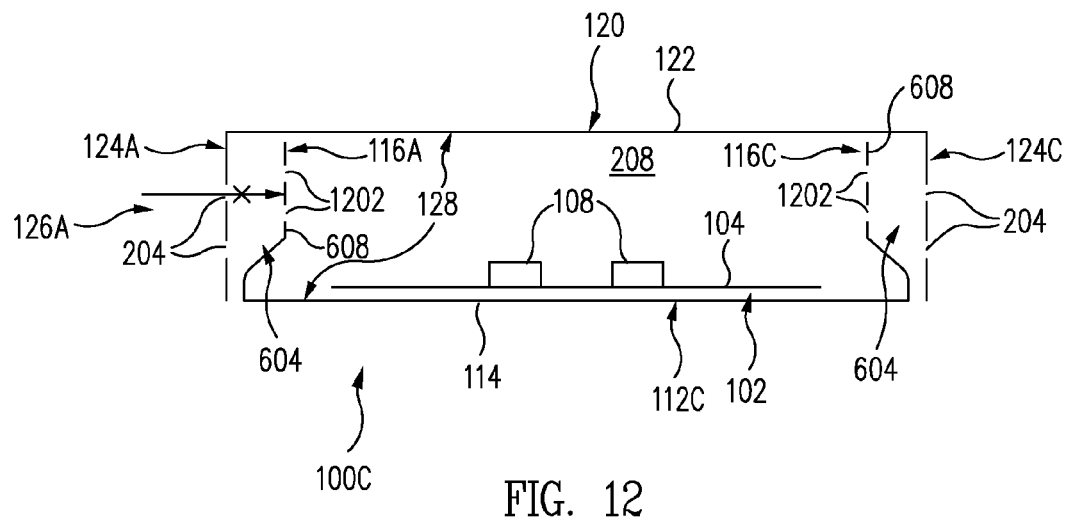
FIG. 12 is a cross-sectional view of an electronic device in accordance with another embodiment.
Figure 13:
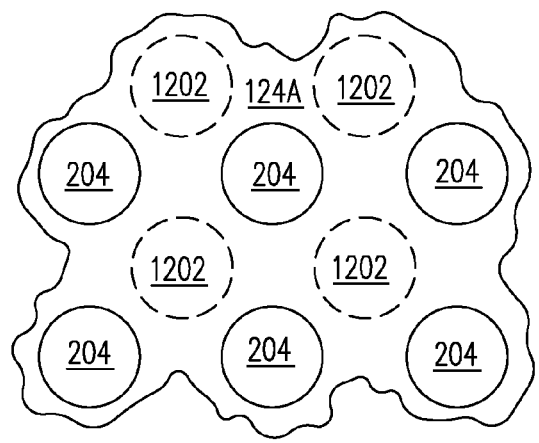
FIG. 13 is a side plan view of a cover sidewall of the electronic device of FIG. 12 in accordance with one embodiment.

FIG. 12 is a cross-sectional view of an electronic device 100C in accordance with another embodiment. FIG. 13 is a side plan view of cover sidewall 124A of electronic device 100C of FIG. 12 in accordance with one embodiment. Electronic device 100C of FIGS. 12-13 is similar to electronic device 100B of FIG. 6-11 with the exception that a chassis base 112C of electronic device 100C of FIGS. 12-13 is formed with venting holes 1202 instead of louvers 602. In FIG. 13, venting holes 1202 are illustrated as dashed circles although it is to be understood that venting holes 1202 are not visible, or only partially visible, in the view of FIG. 13.

Referring now to FIGS. 12 and 13 together, venting holes 1202 formed in chassis sidewalls 116 are offset and not aligned, sometimes called staggered, with respect to cover venting holes 204 in cover sidewalls 124 of cover 120. Venting holes 1202 and cover venting holes 204 are sometimes said to form a staggered venting pattern.

By staggering venting holes 1202 and cover venting holes 204, the line of sight to critical electronic components 108 is blocked. Recess 604 in chassis base 112C allows airflow through cover venting holes 204 and venting holes 1202 to cool electronic device 100C.

The drawings and the forgoing description gave examples of embodiments in accordance with the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. A structure comprising:
   an electronic component;
   an electronic enclosure enclosing the electronic component, the electronic enclosure comprising:

a chassis base comprising:
  a chassis base plate; and
  a chassis sidewall extending in a first direction from the chassis base plate, a venting hole and a flap being formed in the chassis sidewall, the flap blocking visibility of the electronic component through the venting hole; and a cover mounted to the chassis base, wherein the cover comprises:
  a cover plate; and
  a cover sidewall extending in a second direction opposite the first direction from the cover plate, the cover sidewall comprising a cover venting hole exposing the venting hole in the chassis sidewall to the ambient environment.

2. The structure of claim 1 wherein the cover sidewall is directly adjacent the chassis sidewall.

3. The structure of claim 1 wherein the venting hole is defined by a fold and a flap cutout edge in a chassis sidewall of the chassis base.

4. The structure of claim 3 wherein the flap is defined by the fold and a flap edge.

5. The structure of claim 4 wherein the flap edge is the same shape as the flap cutout edge.

6. The structure of claim 4 wherein a line of sight through the venting hole is defined by a line between the flap cutout edge and the flap edge.

7. The structure of claim 6 wherein the line of sight is offset from the electronic component.

8. A structure comprising:
  an electronic component;
  an electronic enclosure enclosing the electronic component, the electronic enclosure comprising:
  a chassis base; and
  a cover mounted to the chassis base, wherein the cover comprises:
  a cover plate; and
  a cover sidewall extending from the cover plate, a venting hole and a flap being formed in the cover sidewall, the flap blocking visibility of the electronic component through the venting hole.

9. A structure comprising:
  an electronic component;
  an electronic enclosure enclosing the electronic component, the electronic enclosure comprising:
  a chassis base comprising:
    a venting hole;
    a louver covering the venting hole, the louver defining venting hole lines of sight through the venting hole; and
    a chassis sidewall comprising:
      a main sidewalk
      a recess sidewall connected to the main sidewall, the recess sidewall defining a recess in the chassis sidewall, the louver extending from the recess sidewall into the recess; and
  a cover mounted to the chassis base, the cover comprising a cover venting hole, wherein a cover venting hole line of sight through the cover venting hole is unaligned with the venting hole lines of sight such that the electronic component is not visible from outside the electronic enclosure.

10. The structure of claim 9 wherein the venting hole is formed in the recess sidewall.

11. The structure of claim 9 wherein the venting hole is defined by louver cutout edges and folds, and wherein the louver is defined by louver edges and the folds.

12. The structure of claim 11 wherein the venting hole lines of sight are defined by lines between the louver edges and the louver cutout edges.

13. A method comprising:
  forming a venting hole and a flap in a chassis sidewall of a chassis base, the chassis sidewall extending in a first direction from a chassis base plate of the chassis base;
  mounting an electronic component to the chassis base; and
  mounting a cover to the chassis base to form an electronic enclosure around the electronic component, wherein the cover comprises:
    a cover plate: and
    a cover sidewall extending in a second direction opposite the first direction from the cover plate, the cover sidewall comprising a cover venting hole exposing the venting hole in the chassis sidewall to the ambient environment, wherein air flows through the venting hole and the flap blocks visibility of the electronic component through the venting hole.

14. The method of claim 13 wherein the forming a venting hole and a flap comprises cutting the flap from the chassis sidewall of the chassis base.

\* \* \* \* \*